(12) United States Patent
Peng et al.

(10) Patent No.: US 9,298,653 B2
(45) Date of Patent: Mar. 29, 2016

(54) SERIAL-PARALLEL INTERFACE CIRCUIT WITH NONVOLATILE MEMORY

(71) Applicant: National Taiwan University of Science and Technology, Taipei (TW)

(72) Inventors: Sheng-Yu Peng, Taipei (TW); Chi-An Lai, Taipei (TW); Chiang-Hsi Lee, Taipei (TW); Tzu-Yun Wang, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 291 days.

(21) Appl. No.: 14/166,869

(22) Filed: Jan. 29, 2014

(65) Prior Publication Data

US 2015/0039802 A1 Feb. 5, 2015

(30) Foreign Application Priority Data

Jul. 30, 2013 (TW) .............................. 102127346 A

(51) Int. Cl.
| | |
|---|---|
| G06F 13/14 | (2006.01) |
| G06F 13/28 | (2006.01) |
| G11C 16/04 | (2006.01) |
| G11C 7/10 | (2006.01) |
| G11C 5/06 | (2006.01) |

(52) U.S. Cl.
CPC ................ *G06F 13/28* (2013.01); *G06F 13/14* (2013.01); *G11C 7/10* (2013.01); *G11C 16/0433* (2013.01); *G11C 5/066* (2013.01); *G11C 2207/107* (2013.01); *G11C 2216/10* (2013.01)

(58) Field of Classification Search
USPC .............................. 710/305, 307, 71; 711/170
See application file for complete search history.

(56) References Cited

U.S. PATENT DOCUMENTS

| | | | | |
|---|---|---|---|---|
| 5,796,672 | A  * | 8/1998 | Pitz et al. ................. | 365/230.03 |
| 6,684,275 | B1 * | 1/2004 | Goldstein ....................... | 710/71 |
| 7,979,629 | B2 * | 7/2011 | Lee et al. ...................... | 711/103 |
| 2007/0162670 | A1 * | 7/2007 | Yang et al. .................... | 710/100 |
| 2013/0091312 | A1 * | 4/2013 | Ken et al. ..................... | 710/106 |

OTHER PUBLICATIONS

A fully reconfigurable low-noise biopotential sensing amplifier.
A low-power programmable bandpass filter section for higher order filter applications. IEEE Transactions on Circuits and System-I : Regular Papers, vol. 54, No. 6, Jun. 2007.

(Continued)

*Primary Examiner* — Khanh Dang
(74) *Attorney, Agent, or Firm* — CKC & Partners Co., Ltd.

(57) ABSTRACT

A serial-parallel interface circuit with nonvolatile memories is provided. A control module generates a plurality of control signals, wherein the control signals include readout and write-in control signals and memory programming control signals. An input terminal receives a plurality of digital data from external. The digital data are transmitted to the input terminal serially. Memory modules are coupled to the input terminal and receive the control signals from the control module. The input terminal transmits the digital data to the memory modules. One of the memory modules includes a memory unit, and the memory unit stores or transmits one bit of the digital data based on a high voltage control signal and a memory control signal. A plurality of output signal lines are respectively coupled to the memory modules. The memory unit transmits the one bit of the digital data to one of the output signal lines.

20 Claims, 5 Drawing Sheets

(56) References Cited

OTHER PUBLICATIONS

An analog programmable multidimensional radial basis function based classifier. IEEE Transactions on Circuits and System-I : Regular Papers, vol. 54, No. 10, Oct. 2007.

Analog module architecture for space-qualified field-programmable mixed-signal arrays. Sep. 27, 1999.

A CMOS programmable analog memory-cell array using floating-gate circuits. IEEE Transactions on Circuits and System-II : Analog and Digital Signal Processing, vol. 48, No. 1, Jan. 2001.

A Floating-Gate-Based Field-Programmable Analog Array. IEEE Journal of Solid-State Circuits, vol. 45, No. 9, Sep. 2010.

Serial-Parallel Interface Circuit with Non-Volatile Memories in a Standard CMOS Process.

\* cited by examiner

SERIAL-PARALLEL INTERFACE CIRCUIT WITH NONVOLATILE MEMORY

RELATED APPLICATIONS

This application claims priority to Taiwan Application Serial Number 102127346, filed Jul. 30, 2013, which is herein incorporated by reference.

BACKGROUND

1. Field of Invention

The present invention relates to a serial-parallel interface circuit. More particularly, the present invention relates to a serial-parallel interface circuit with non-volatile memories applied to a reconfigurable circuit system capable of reducing the cost and saving circuit initialization time effectively.

2. Description of Related Art

Conventional reconfigurable circuits and systems use memories for storing the configurations and parameters. To avoid the usage of a large number of pins, digital control signals are usually transmitted into the system in series via a serial-parallel interface circuit. However, to set the system configuration properly, an external device with non-volatile memories is required to perform the initialization procedure by sending the desired data through the serial-parallel interface circuit.

In practical applications, conventional non-volatile memory devices can be used in digital systems to reduce the hardware complexity and the time required for initialization. Some conventional non-volatile memory devices use the antifuses to selectively connect to the nodes in the circuit, which effectively reduce the equivalent resistance of the connection points and achieve high area efficiency. However, such devices can only be programmed once and requires a more expensive manufacturing process, resulting in higher production cost.

For the foregoing reasons, there is a need for solving the above-mentioned problems by providing a serial-parallel interface circuit with nonvolatile memories that are readable, writable, reprogrammable, and capable of reducing the initialization time and cost effectively.

SUMMARY

In view of the foregoing problems of the prior art, it is an object of the present invention to provide a serial-parallel interface circuit with nonvolatile memories that are readable, writable, reprogrammable, and capable of reducing the initialization time and cost effectively.

According to one aspect of the present invention, a serial-parallel interface circuit using a floating-gate metal-oxide-semiconductor field-effect transistor (floating-gate MOSFET) manufactured by a standard complementary metal-oxide-semiconductor (CMOS) process as a memory is provided to reduce cost.

According to another aspect of the present invention, the present invention provides a serial-parallel interface circuit with nonvolatile memories being able to perform conventional operations with little circuit area consumption.

According to still another aspect of the present invention, a serial-parallel interface circuit is provided. The serial-parallel interface circuit comprises a control module, an input terminal, a plurality of memory modules, and a plurality of output signal lines. In addition, the control module generates a plurality of control signals. The control signals comprise a high voltage control signal and a memory control signal. The control signals are read or written via an interface circuit. It should be noted that the output terminal receives a plurality of digital data from external. The digital data are transmitted to the input terminal in series.

In practical applications, the memory modules are coupled to the input terminal and receive the control signals from the control module. The input terminal transmits the digital data to the memory modules. In addition, one of the memory modules comprises a memory unit. The memory unit stores one bit of the digital data or transmits the one bit of the digital data based on the high voltage control signal and the memory control signal read or written via the interface circuit. In one embodiment, the memory unit is a non-volatile memory, but the present invention is not limited in this regard. The output signal lines are respectively coupled to the memory modules. The memory unit transmits the one bit of the digital data to one of the output signal lines.

According to yet another aspect of the present invention, a serial-parallel interface circuit coupled to a control module is provided. It is noted that the control module generates a high voltage control signal, a memory control signal, an erase control signal, a register output signal, and a memory output signal. The above-mentioned control signals are read or written via an interface circuit. The memory control signal comprises a high memory control signal and a low memory control signal. In the present embodiment, the serial-parallel interface circuit comprises an input terminal, a plurality of memory modules, and a plurality of output signal lines. The input terminal receives a plurality of digital data from external. The digital data are transmitted to the input terminal in series.

Additionally, the memory modules are coupled to the input terminal. The input terminal transmits the digital data to the memory modules. It should be noted that one of the memory modules comprises a memory unit. The memory unit stores one bit of the digital data or transmits the one bit of the digital data based on the high voltage control signal and the memory control signal. In practical applications, the memory unit stores the one bit of the digital data or transmits the one bit of the digital data based on the high voltage control signal and the memory control signal read or written via the interface circuit. In greater detail, the output signal lines are respectively coupled to the memory modules. The memory unit transmits the one bit of the digital data to one of the output signal lines.

When compared with the prior art, the present invention serial-parallel interface circuit determines to store one bit of the digital data in the memory unit or transmit the one bit of the digital data to the next memory module based on the high voltage control signal and the memory control signal. In greater detail, the memory module programs the digital data stored in the memory unit using the tunneling effect and the hot carrier injection effect. However, the present invention is not limited in this regard. In addition to that, the memory module further has a flip-flop, and utilizes a logic design employing NAND gate, AND gate, NOR gate, NOT gate, etc. so as to shift, read, download, program, and memorize the digital data. It is noted that the present invention serial-parallel interface circuit uses a floating-gate MOSFET as the memory unit that can be manufactured in a standard CMOS process. Such a process does not require a complex technology, and the area of the floating-gate MOSFET is small to result in a low cost. In addition, the present invention circuit can simplify the logic design operations and utilize electronic devices having small areas. As a result, the circuit area is saved and the cost is lowered.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
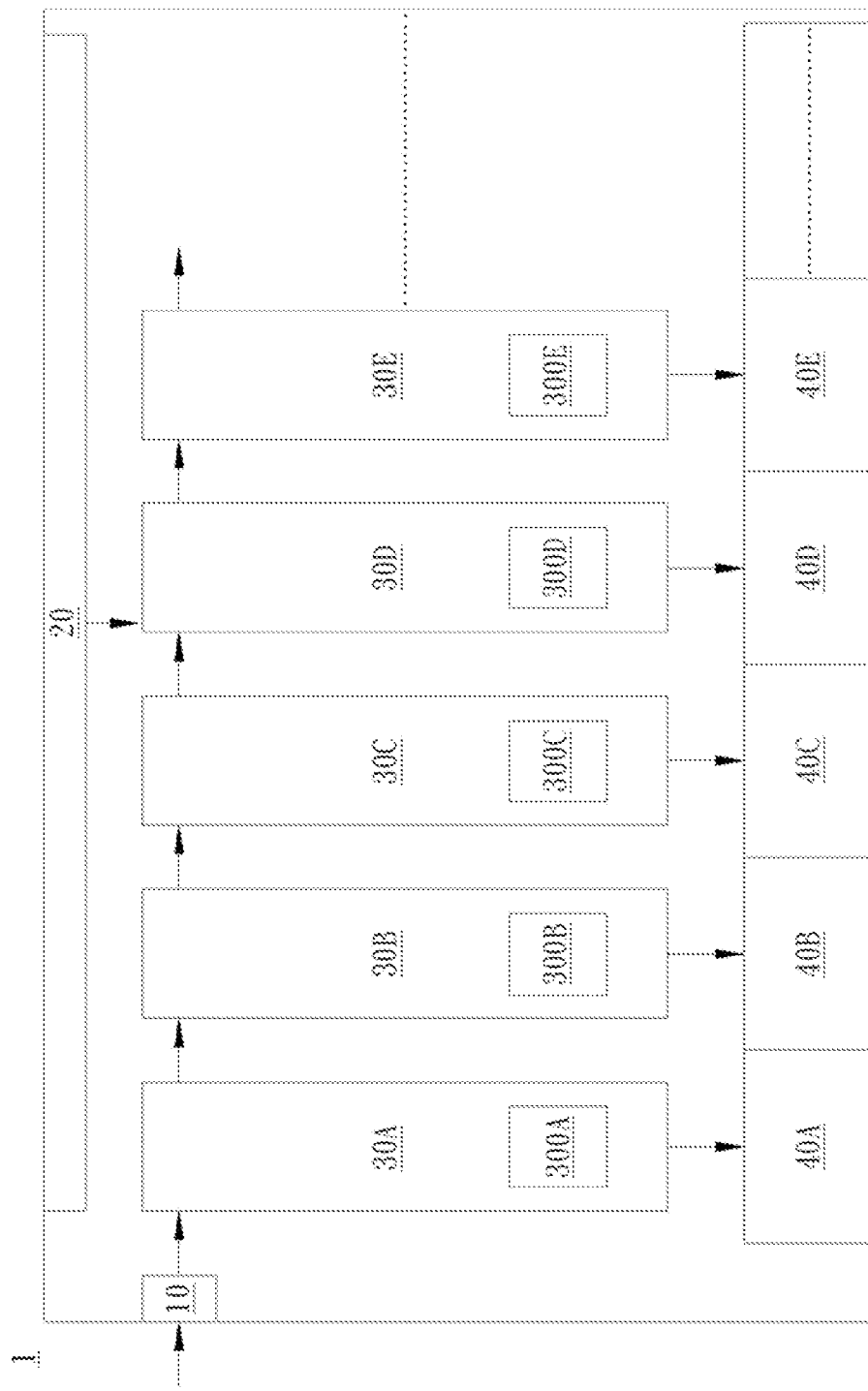
FIG. 1 is a schematic diagram of a serial-parallel interface circuit according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

According to one embodiment of the present invention, a serial-parallel interface circuit applied to a digital circuit is provided. In the present embodiment, the serial-parallel interface circuit is capable of saving a circuit area and reducing cost.

FIG. 1 is a schematic diagram of a serial-parallel interface circuit according to one embodiment of this invention. As shown in FIG. 1, the serial-parallel interface circuit 1 comprises an input terminal 10, a control module 20, a plurality of memory modules 30A, 30B, 30C, 30D, 30E, and a plurality of output signal lines 40A, 40B, 40C, 40D, 40E. According to the present embodiment, the serial-parallel interface circuit 1 is disposed in a digital circuit, but the present invention is not limited in this regard. In addition, the input terminal 10 receives a plurality of digital data from external, and the plurality of digital data are transmitted to the input terminal 10 in series. In other words, the input terminal 10 of the serial-parallel interface circuit 1 is a serial signal input interface. In practical applications, since the serial signal input interface inputs signals in series, there is no need to dispose a large number of pins at the input terminal of the serial-parallel interface circuit 1. As a result, the circuit area is greatly reduced. It is noted that the plurality of output signal lines 40A-40E are disposed on an output interface of the serial-parallel interface circuit 1 in parallel so that the output interface is able to output digital data in parallel.

Figure 2:
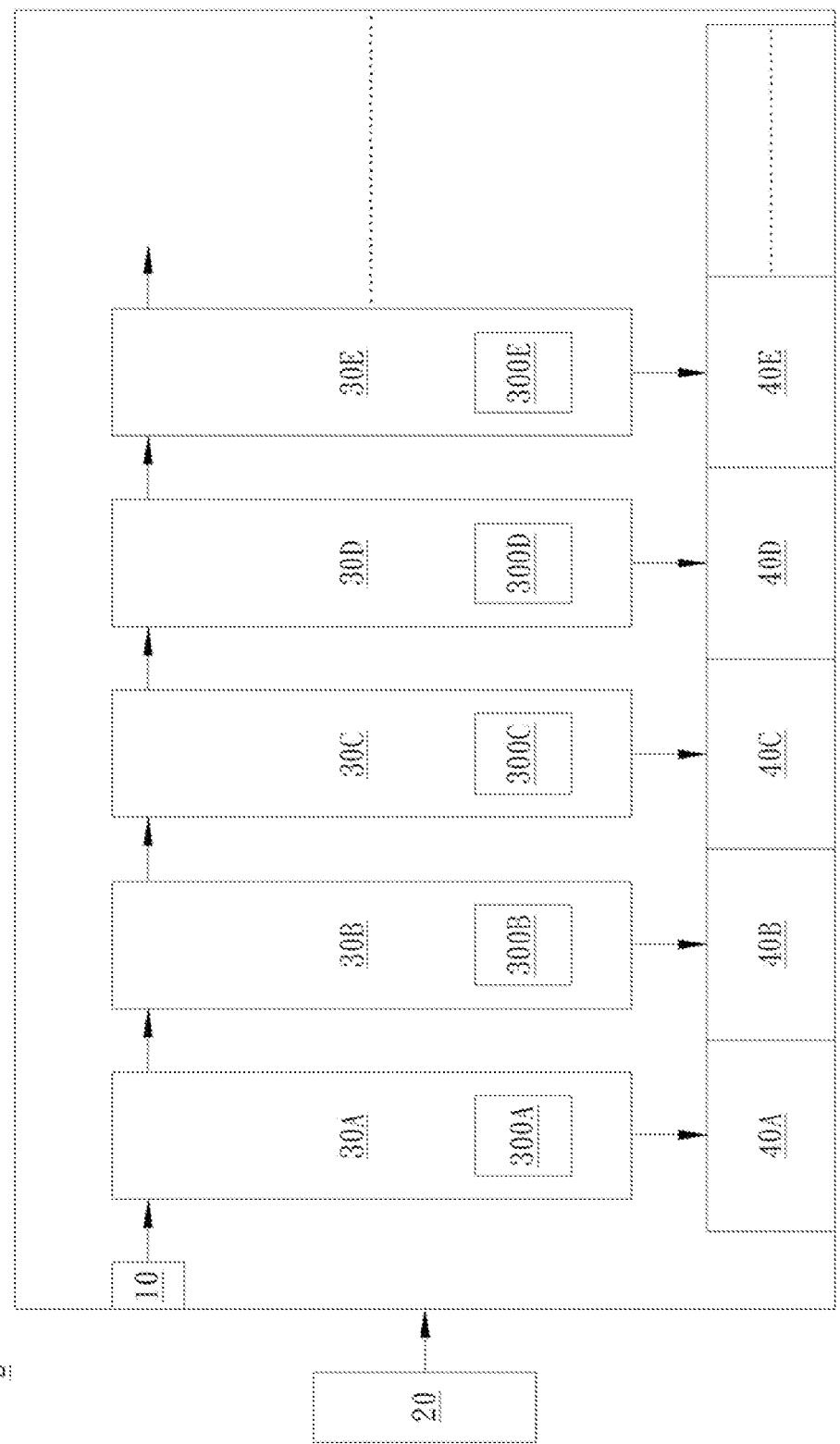
FIG. 2 is a schematic diagram of a serial-parallel interface circuit according to another embodiment of this invention.

It should be noted that the control module 20 generates a plurality of control signals. The control signals comprise a high voltage control signal and a memory control signal so as to control the logical operations of other modules. In the present embodiment, the control module 20 is disposed in the architecture of the serial-parallel interface circuit 1. However, the present invention is not limited in this regard. FIG. 2 is a schematic diagram of a serial-parallel interface circuit according to another embodiment of this invention. As shown in FIG. 2, the control module 20 is disposed outside a serial-parallel interface circuit 2, and the serial-parallel interface circuit 2 is coupled to the control module 20. In practical applications, the control module 20 transmits the control signals to the serial-parallel interface circuit 2 from external to drive the serial-parallel interface circuit 2. As for the input terminal 10, the plurality of memory modules 30A-30E, and the plurality of output signal lines 40A-40E of the serial-parallel interface circuit 2, they have the same architectures as those in the serial-parallel interface circuit 1. Explanation of the input terminal 10, the plurality of memory modules 30A-30E, and the plurality of output signal lines 40A-40E is provided in the following by way of the embodiment shown in FIG. 2.

As shown in FIG. 2, the memory modules 30A-30E are coupled to the input terminal 10 and receive the control signals from the control module 20. The input terminal 10 transmits the digital data to the memory modules 30A-30E. In greater detail, the memory modules 30A-30E are coupled to each other in series, and the memory module 30A is coupled to the input terminal 10. In addition, a number of the memory modules 30A-30E and the output signal lines 40A-40E are determined based on memory capacity of the serial-parallel interface circuit 2, and no special requirements are necessary.

It is noted that the memory modules 30A-30E respectively comprise memory units 300A-300E, and the digital data are mainly stored in the memory units 300A-300E. In practical applications, R&D personnel may store parameters required by the digital circuit or other digital data in memory units 300A-300E in advance, and the serial-parallel interface circuit 2 may use digital data already existing in the memory units 300A-300E or the digital data transmitted from the input terminal 10 based on the high voltage control signal and the memory control signal which are read or written via an interface circuit. Furthermore, in the initial stage of circuit startup. R&D personnel may design different operation modes applicable to various chips, so as to develop diversified (or customized) logic chips. In practical applications, the customized chip can use the preset parameters directly instead of being driven by many external control signals to increase the utilization efficiency of circuit system.

In the present embodiment, the memory module 30A comprises the memory unit 300A, and the memory unit 300A stores one bit of the digital data or transmits the one bit of the digital data based on the high voltage control signal and the memory control signal. It should be noted that the memory control signal uses the data values input in series to control the turn-on and turn-off of the floating-gate metal-oxide-semiconductor field-effect transistor (floating-gate MOSFET). The memory control signal also determines whether to store the one bit of the digital data or to transmit the one bit of the digital data together with the control signal read or written by the interface circuit. Explanation of the detailed structure and operation of the memory module is provided by way of the embodiment shown in FIG. 4.

Additionally, the output signal lines 40A-40E are respectively coupled to the memory units 30A-30E. The output signal line 40A is coupled to the memory module 30A. The output signal line 40B is coupled to the memory module 30B. The output signal line 40C is coupled to the memory module 30C. The output signal line 40D is coupled to the memory module 30D. The output signal line 40E is coupled to the memory module 30E. That is, each of the memory modules corresponds to one output signal line, and the memory units 300A-300E can transmit the digital data to the output signal lines 40A-40E respectively. For example, the memory module 30A corresponds to the output signal line 40A, and the memory unit of 300A of the memory module 30A transmits the digital data to the output signal line 40A.

Figure 3:
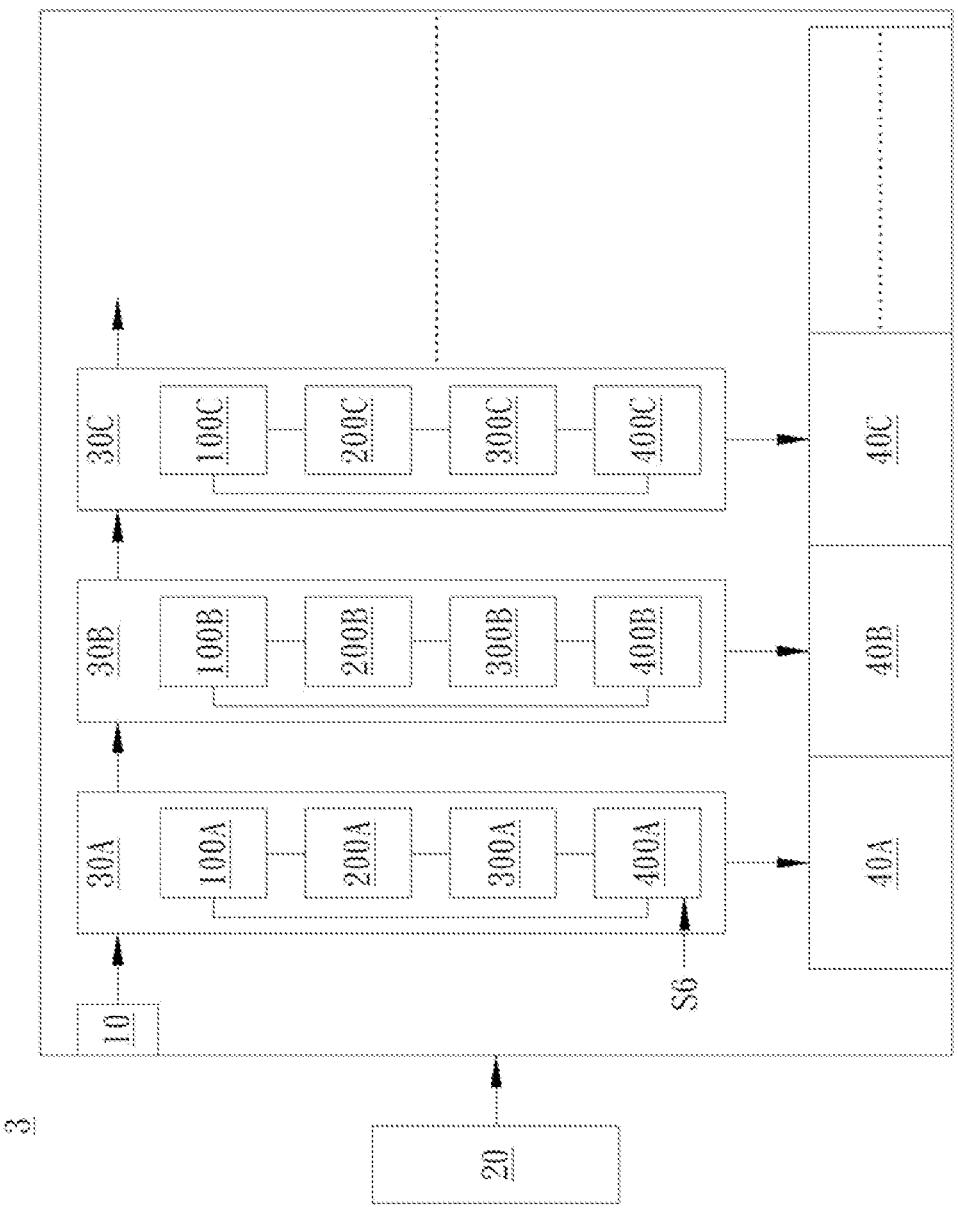
FIG. 3 is a schematic diagram of a serial-parallel interface circuit according to still another embodiment of this invention.

FIG. 3 is a schematic diagram of a serial-parallel interface circuit according to still another embodiment of this invention. As shown in FIG. 3, the memory modules 30A-30C of a serial-parallel interface circuit 3 respectively comprise first register units 100A-100C and second register units 200A-200C. It should be noted that the first register unit 100A of the memory module 30A is coupled to the input terminal 10. The input terminal 10 transmits the one bit of the digital data to the first register unit 100A, and the one bit of the digital data stored in the memory unit 300A is the one bit of the digital data received by the first register unit 100A or one bit of the digital data stored in a non-volatile memory of the same unit (the memory unit 300A). In other words, the one bit of the digital data is first transmitted to the first register unit 100A from the input terminal 10, then transmitted to the second register unit 200A, and then transmitted to the memory unit 300. The memory unit 300A stores the one bit of the digital data. In practical applications, the one bit of the digital data stored in the memory unit 300A may also be data stored in the non-volatile memory of the memory unit 300A.

As shown in FIG. 3, the second register units 200A-200C are respectively coupled between the first register units 100A-100C and the memory units 300A-300C. The second register unit 200A is coupled between the first register unit 100A and the memory unit 300A. According to the present embodiment, the first register unit 100A and the second register unit 200A are flip-flops having the function of a shift register.

In practical applications, take the memory module 30A as an example, the first register unit 100A transmits the one bit of the digital data to the second register unit 200A or transmits the one bit of the digital data to the adjacent memory module 30B. In consideration of effect, the first register unit 100A transmits the one bit of the digital data to the second register unit 200A and may transmit the one bit of the digital data to the adjacent memory module 30B. In other words, the serial-parallel interface circuit 3 uses the first register unit 100A to store the one bit of the digital data temporarily, and the first register unit 100A determines that the one bit of the digital data is shifted to the second register unit 200A and may be transmitted to the first register unit 100B of the next memory module 30B based on the control signals. In addition, when the one bit of the digital data is stored in the second register unit 200A of the memory module 30A, the second register unit 200A may transmit the one bit of the digital data to the memory unit 300A. Furthermore, the serial-parallel interface circuit 3 uses the first register units 100A-100C and the second register units 200A-200C to store and shift the digital data so as to process the digital data input in series.

Figure 4:
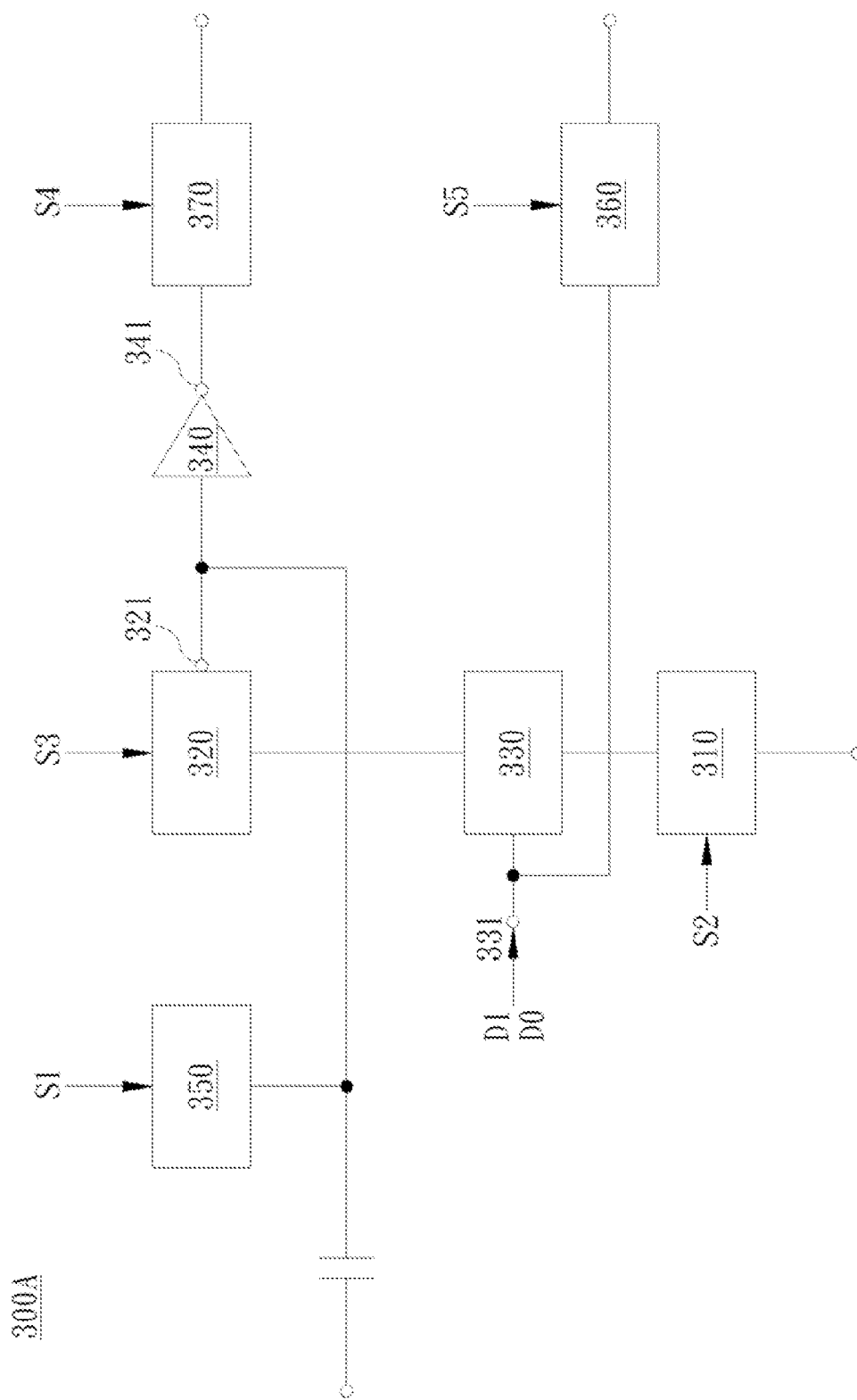
FIG. 4 is a schematic diagram of a memory unit according to one embodiment of this invention.

FIG. 4 is a schematic diagram of a memory unit according to one embodiment of this invention. As shown in FIG. 4, the memory unit 300A comprises a memory control switch 310, a memory transistor 320, a current control switch 330, an inverter 340, an erase unit 350, a register output switch 360, and a memory output switch 370. The current control switch 330 is coupled between the memory control switch 310 and the memory transistor 320. The erase unit is 350 is coupled between the memory transistor 320 and the inverter 340. The inverter 340 is coupled to the memory output switch 370. The current control switch 330 is coupled to the register output switch 360.

It should be noted that the memory transistor 320 is a floating-gate MOSFET, but the present invention is not limited in this regard. In practical applications, the cost of a floating-gate MOSFET is low and the devices utilized in the memory unit 300A do not occupy large areas so as to effectively save the circuit area and reduce cost.

Additionally, the current control switch 330 is coupled to a data input terminal 331, and the second register unit 200A transmits the one bit of the digital data to the memory unit 300A through the data input terminal 331. It is noted that the memory transistor 320 has a memory gate 321 in which the digital data are stored. In greater detail, the control signals comprise an erase control signal S1. In practical applications, the erase unit 350 is coupled to the memory gate 321. When the erase control signal S1 is transmitted to the erase unit 350, the erase unit 350 applies an erasing voltage to the memory gate 321 to allow the memory gate 321 to have a high level.

In practical applications, the erasing voltage is a high voltage ranging from approximately 10 volts to 12 volts, but the present invention is not limited in this regard. In addition, a logic value of the high level is 1. After the inverter 340 inverts the high level, an output terminal 341 of the inverter 340 is at a low level, and a logic value of the low level is 0. In other words, the memory unit 300A utilizes the erase unit 350 to erase one bit of the digital data stored in the memory gate 321 so as to avoid residual data. In greater detail, the erase unit 350 erases electric charges in the memory unit 300A by using F-N tunneling effect. However, the present invention is not limited in this regard.

It is noted that the memory control signal S2 comprises a high memory control signal and a low memory control signal. A digital logic value of the high memory control signal is 1. A digital logic value of the low memory control signal is 0. When the control module 20 transmits the high memory control signal to the memory control switch 310, the memory control switch 310 is turned on. When the control module 20 transmits the low memory control signal to the memory control switch 310, the memory control switch 310 is turned off. It should be noted that the memory control signal S2 is a control signal for writing into memory. If one bit of data needs to be written into the memory, the digital logic value of the control signal is 1. If one bit of data in the memory does not need to be changed, the digital logic value of the control signal is 0. When the control module 20 transmits the digital logic value 1 to the memory control switch 310, the memory control switch 310 is turned on. When the control module 20 transmits the digital logic value 0 to the memory control switch 310, the memory control switch 310 is turned off. In greater detail, even if the memory control switch 310 is turned on, the memory unit 300A still needs to determine whether to write one bit of the digital data into the memory gate 321 based on a high voltage control signal S3. When the memory control switch 310 is turned off, one bit of the digital data will not be written into the memory gate 321 even if the memory unit 300A receives the high voltage control signal S3.

Additionally, the data input terminal 331 of the current control switch 330 receives the one bit of the digital data stored in the second register unit 200A. When the memory control switch 310 is turned on, the current control switch 330 determines whether a current passes through the memory transistor 320 based on the high voltage control signal S3 and the one bit of the digital data stored in the current control switch 330. It should be noted that when the control module 120 transmits the high voltage control signal S3 to the memory transistor 320, a high voltage ranging from approximately 5 volts to 6 volts is applied to a source of the memory transistor 320. However, the present invention is not limited in this regard. A power supply module may be disposed at the source of the memory transistor 320 of the memory unit 300A so as to provide a voltage. In practical applications, the high voltage control signal S3 drives the memory transistor 320 to allow the memory transistor 320 to have a sufficient drain-to-source voltage (VDS) so that the memory transistor 320 is able to change the electric charges in the memory unit 300A by using hot carrier injection effect. However, the present invention is not limited in this regard.

In the present embodiment, the one bit of the digital data comprises a logic high data D1 and a logic low data D0. In digital circuits, a digital logic value of the logic high data D1 is 1. A digital logic value of the logic low data D0 is 0. In addition, the current control switch 330 determines that the current passes through the memory transistor 320 based on the high voltage control signal S3 and the logic high data D1 to allow the memory gate 321 to be at the low level. Conversely, the current control switch 330 determines that the current does not pass through the memory transistor 320 based on the high voltage control signal S3 and the logic low data D0 to allow the memory gate 321 to be at the high level. In greater detail, the memory unit 300A uses the hot carrier injection effect to drive the memory transistor 320 so as to control whether the current flows through the source terminal and the drain terminal of the memory transistor 320. As a result, a potential of a gate terminal (the memory gate 321) is controlled, but the present invention is not limited in this regard.

In practical applications, if the data input terminal 331 receives the logic high data D1 and it is determined that the memory transistor 320 stores the one bit of the digital data, the memory gate 321 will be at the low level. If the data input terminal 331 receives the logic low data D0 and it is determined that the memory transistor 320 stores the one bit of the digital data, the memory gate 321 will be at the high level.

As shown in FIG. 4, an input terminal of the inverter 340 is coupled to the memory gate 321, and the inverter 340 has the output terminal 341. When the memory gate 321 is at the low level, the inverter 340 inverts the low level so that the output terminal 341 is at the high level to output the logic high data D1. In addition, when the memory gate 321 is at the high level, the inverter 340 inverts the high level so that the output terminal 341 is at the low level to output the logic low data D0.

In other words, if the data input terminal 331 receives the logic high data D1 and it is determined that the memory transistor 320 stores the one bit of the digital data, the output terminal 341 will output the logic high data D1 after the inverse operation of the inverter 340. Conversely, if the data input terminal 331 receives the logic low data D0 and it is determined that the memory transistor 320 stores the one bit of the digital data, the output terminal 341 will output the logic low data D0 after the inverse operation of the inverter 340.

Additionally, the control signals comprise a memory output signal S4 and a register output signal S5. It is noted that the memory unit 300A determines whether to output the one bit of the digital data currently stored in the memory gate 321 or to output the one bit of the digital data transmitted from the second register unit 200A based on the memory output signal S4 and the register output signal S5.

As shown in FIG. 4, the memory output switch 370 is coupled to the inverter 340. When the memory control switch 310 is turned off, the memory output switch 370 is turned on based on the memory output signal S4 to output the one bit of the digital data at the output terminal 341 of the inverter 340. For example, if the output terminal 341 of the inverter 340 has the logic high data D1, the memory output switch 370 will be turned on based on the memory output switch S4 to output the logic high data D1.

In addition to that, the memory unit 300A may directly utilize the one bit of the digital data transmitted from the second register unit 200A rather than the one bit of the digital data stored in the memory gate 321. As shown in FIG. 4, the register output switch 360 is coupled to the current control switch 330. In greater detail, the register output switch 360 is coupled between the data input terminal 331 and the current control switch 330. It should be noted that, when the memory control switch 330 is turned off, the register output switch 360 is turned on based on the register output signal S5 to output the one bit of the digital data at the data input terminal 331. For example, if the data input terminal 331 has the logic low data D0, the register output switch 360 will be turned on based on the register output signal S5 to output the logic low data D0.

In practical applications, the memory unit 300A determines to output the one bit of the digital data transmitted from the second register unit 200A based on the register output signal S5. Or, the memory unit 300A determines to output the one bit of the digital data stored at the output terminal 341 of the inverter 340 based on the memory output signal S4. R&D personnel may set the memory output signal S4 in the initial stage of circuit design so that the serial-parallel interface circuit 3 is allowed to use the stored parameters (the digital data) directly to perform a further action.

Figure 5:
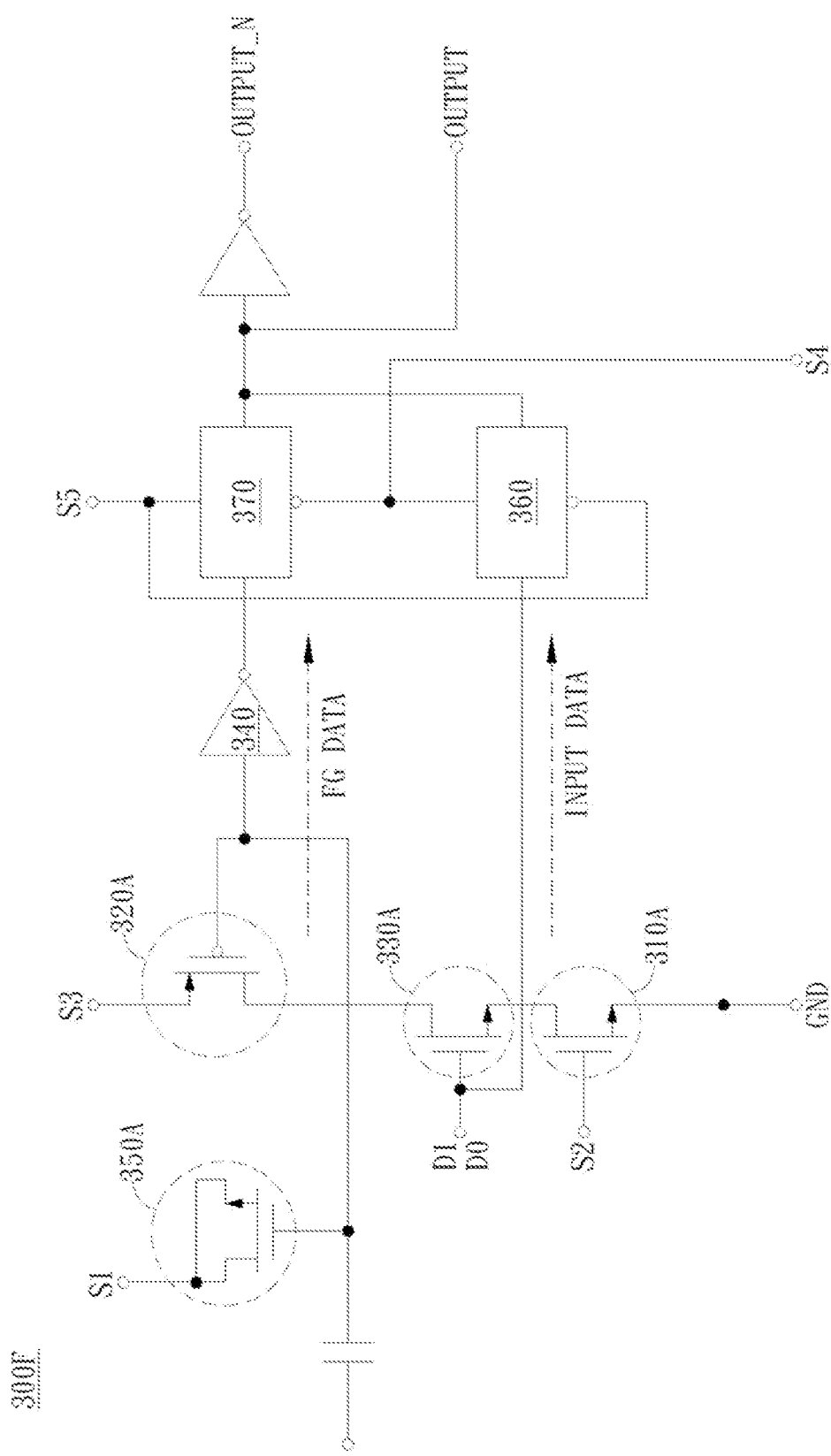
FIG. 5 is a schematic diagram of a memory unit according to another embodiment of this invention.

FIG. 5 is a schematic diagram of a memory unit according to another embodiment of this invention. As shown in FIG. 5, different from the memory unit 300A shown in FIG. 4, the memory unit 300F has a memory control switch 310A, a memory transistor 320A, a current control switch 330A, and an erase unit 350A. The memory control switch 310A, the current control switch 330A, and the erase unit 350 are all transistor switches, and the memory transistor 320A is a floating-gate MOSFET. Additionally, the memory transistor 320A (the floating-gate MOSFET) transmits floating-gate data (FG data) to the memory output switch 370. Or, input data are transmitted to the register output switch 360. In addition to that, the memory output switch 370 is turned on based on the memory output switch S4. Or, the register output switch is turned on based on the register output signal S5.

In practical applications, the memory unit 300F occupies a smaller circuit area, and the devices utilized are not fabricated by special processes. Hence, the cost is lowered. Furthermore, a serial-parallel interface circuit can use the memory unit 300F to achieve the functions of storage and memory with a low cost, thus having an extremely high industrial value.

In addition, with reference to FIG. 3, the control signals comprise a verification readout control signal S6 according to the present embodiment, and verification readout units 400A-400C are respectively coupled to the first register units 100A-100C and the memory units 300A-300C. Take the memory module 30A as an example, the verification readout unit 400A transmits the one bit of the digital data stored in the memory unit 300A to the first register unit 100A based on the verification readout control signal S6. In other words, the verification readout unit 400A outputs the one bit of the digital data stored in the memory unit 300A and writes the one bit of the digital data into the first register unit 100A.

For example, the first register unit 100A stores the logic high data D1 and transmits the logic high data D1 to the second register unit 200A and the memory unit 300A in sequence. If users intend to make sure whether the one bit of the digital data stored in the memory unit 300A is the logic high data D1, data in the memory unit 300A can be written into the first register unit 100A based on the verification readout control signal S6, and then read out by shift registers in the first register units 100A-100C sequentially. In practical applications, users may further confirm information regarding to the current parameter values set in the serial-parallel interface circuit 3 through the verification readout unit 400A. In greater detail, the verification readout unit 400A is a simple logic control circuit that occupies a small circuit area and has a low cost.

When compared with the prior art, the present invention serial-parallel interface circuit 3 determines to store one bit of the digital data in the memory unit 300A based on the high voltage control signal S3 and the memory control signal S2. The present invention serial-parallel interface circuit 3 may also utilize the verification readout unit 400A to write one bit of the digital data into the memory unit 100A, and then transmits one bit of the digital data to the next memory module 30B so as to read out the digital data sequentially. In greater detail, the memory module 30A programs the digital data stored in the non-volatile memory of the memory unit using the tunneling effect and the hot carrier injection effect. In addition to that, the memory module 30A further has a flip-flop and utilizes a logic design (e.g., NAND gate, AND gate, NOR gate, NOT gate, etc) for shifting, reading, downloading, programming, and memorizing the digital data. The present invention serial-parallel interface circuit 3 uses a floating-gate MOSFET as the memory unit that can be manufactured in a standard complementary metal-oxide-semiconductor (CMOS) process. Such a process does not require extra masks, and the area of the floating-gate MOSFET is small resulting in low cost. In addition, the present invention circuit can simplify the system start-up operations and utilize electronic devices having small areas. As a result, the circuit area is saved and the cost is lowered.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A serial-parallel interface circuit comprising:
    a control module generating a plurality of control signals, the control signals comprising a high voltage control signal and a memory control signal;
    an input terminal receiving a plurality of digital data from external, the digital data being transmitted to the input terminal in series; and
    a plurality of memory modules coupled to the input terminal and receiving the control signals from the control module, the input terminal transmitting the digital data to the memory modules, one of the memory modules comprising:
        a memory unit storing one bit of the digital data or transmitting the one bit of the digital data based on the high voltage control signal and the memory control signal, the memory control signal comprising a high memory control signal and a low memory control signal; and
        a plurality of output signal lines respectively coupled to the memory modules, the memory unit transmitting the one bit of the digital data to one of the output signal lines.

2. The serial-parallel interface circuit of claim 1, wherein the memory unit comprises:
    a memory control switch, the memory control switch being turned on when the control module transmits the high memory control signal to the memory control switch, the memory control switch being turned off when the control module transmits the low memory control signal to the memory control switch.

3. The serial-parallel interface circuit of claim 2, wherein the memory unit comprises:
    a memory transistor having a memory gate.

4. The serial-parallel interface circuit of claim 3, wherein the memory unit comprises:
    a current control switch coupled between the memory control switch and the memory transistor and receiving the one bit of the digital data, the current control switch determining whether a current passes through the memory transistor based on the high voltage control signal and the one bit of the digital data stored in the current control switch when the memory control switch is turned on.

5. The serial-parallel interface circuit of claim 4, wherein the control signals comprise a verification readout control signal, and the one of the memory modules further comprises:
    a first register unit coupled to the input terminal, the input terminal transmitting the one bit of the digital data to the first register unit, and the one bit of the digital data stored in the memory unit being the one bit of the digital data received by the first register unit;
    a second register unit coupled between the first register unit and the memory unit, the first register unit transmitting the one bit of the digital data to the second register unit or transmitting the one bit of the digital data to the memory module adjacent to the one of the memory modules, and the second register unit transmitting the one bit of the digital data to the memory unit when the second register unit has the one bit of the digital data; and
    a verification readout unit coupled to the first register unit and the memory unit, the verification readout unit transmitting the one bit of the digital data stored in the memory unit to the first register unit based on the verification readout control signal.

6. The serial-parallel interface circuit of claim 4, wherein the control signals further comprise a erase control signal, and the memory unit further comprises:
    an erase unit coupled to the memory gate, the erase unit applying an erasing voltage to the memory gate to allow the memory gate to have a high level when the erase control signal is transmitted to the erase unit.

7. The serial-parallel interface circuit of claim 4, wherein the one bit of the digital data comprises a logic high data and a logic low data, the current control switch determines that the current passes through the memory transistor based on the high voltage control signal and the logic high data to allow the memory gate to be at a low level, or the current control switch determines that the current does not pass through the memory transistor based on the high voltage control signal and the logic low data to allow the memory gate to be at a high level.

8. The serial-parallel interface circuit of claim 7, wherein the memory unit further comprises:
    an inverter coupled to the memory gate and having an output terminal, the inverter inverting the low level so that the output terminal is at the high level to output the logic high data when the memory gate is at the low level, or the inverter inverting the high level so that the output terminal is at the low level to output the logic low data when the memory gate is at the high level.

9. The serial-parallel interface circuit of claim 8, wherein the memory unit further comprises:
- a memory output switch coupled to the inverter, the memory output switch being turned on based on a memory output signal to output the logic high data at the output terminal of the inverter when the memory control switch is turned off.

10. The serial-parallel interface circuit of claim 7, wherein the memory unit further comprises:
- a register output switch coupled to the current control switch, the register output switch being turned on based on a register output signal to output the logic low data when the memory control switch is turned off.

11. A serial-parallel interface circuit coupled to a control module, the control module generating a high voltage control signal, a memory control signal, an erase control signal and a verification readout control signal, the memory control signal comprising a high memory control signal and a low memory control signal, and the serial-parallel interface circuit comprising:
- an input terminal receiving a plurality of digital data from external, the digital data being transmitted to the input terminal in series; and
- a plurality of memory modules coupled to the input terminal, the input terminal transmitting the digital data to the memory modules, one of the memory modules comprising:
  - a memory unit storing one bit of the digital data or transmitting the one bit of the digital data based on the high voltage control signal and the memory control signal; and
  - a plurality of output signal lines respectively coupled to the memory modules, the memory unit transmitting the one bit of the digital data to one of the output signal lines.

12. The serial-parallel interface circuit of claim 11, wherein the memory unit comprises:
- a memory control switch, the memory control switch being turned on when the control module transmits the high memory control signal to the memory control switch, the memory control switch being turned off when the control module transmits the low memory control signal to the memory control switch.

13. The serial-parallel interface circuit of claim 12, wherein the memory unit comprises:
- a memory transistor having a memory gate.

14. The serial-parallel interface circuit of claim 13, wherein the memory unit comprises:
- a current control switch coupled between the memory control switch and the memory transistor and receiving the one bit of the digital data, the current control switch determining whether a current passes through the memory transistor based on the high voltage control signal and the one bit of the digital data stored in the current control switch when the memory control switch is turned on.

15. The serial-parallel interface circuit of claim 14, wherein the one of the memory modules further comprises:
- a first register unit coupled to the input terminal, the input terminal transmitting the one bit of the digital data to the first register unit, and the one bit of the digital data stored in the memory unit being the one bit of the digital data received by the first register unit;
- a second register unit coupled between the first register unit and the memory unit, the first register unit transmitting the one bit of the digital data to the second register unit or transmitting the one bit of the digital data to the memory module adjacent to the one of the memory modules, and the second register unit transmitting the one bit of the digital data to the memory unit when the second register unit has the one bit of the digital data; and
- a verification readout unit coupled to the first register unit and the memory unit, the verification readout unit transmitting the one bit of the digital data stored in the memory unit to the first register unit based on the verification readout control signal.

16. The serial-parallel interface circuit of claim 14, wherein the memory unit further comprises:
- an erase unit coupled to the memory gate, the erase unit applying an erasing voltage to the memory gate to allow the memory gate to have a high level when the control module transmits the erase control signal to the erase unit.

17. The serial-parallel interface circuit of claim 14, wherein the one bit of the digital data comprises a logic high data and a logic low data, the current control switch determines that the current passes through the memory transistor based on the high voltage control signal and the logic high data to allow the memory gate to be at a low level, or the current control switch determines that the current does not pass through the memory transistor based on the high voltage control signal and the logic low data to allow the memory gate to be at a high level.

18. The serial-parallel interface circuit of claim 17, wherein the memory unit further comprises:
- an inverter coupled to the memory gate and having an output terminal, the inverter inverting the low level so that the output terminal is at the high level to output the logic high data when the memory gate is at the low level, or the inverter inverting the high level so that the output terminal is at the low level to output the logic low data when the memory gate is at the high level.

19. The serial-parallel interface circuit of claim 18, wherein the memory unit further comprises:
- a memory output switch coupled to the inverter, the memory output switch being turned on based on a memory output signal to output the logic high data at the output terminal of the inverter when the memory control switch is turned off.

20. The serial-parallel interface circuit of claim 17, wherein the memory unit further comprises:
- a register output switch coupled to the current control switch, the register output switch being turned on based on a register output signal to output the logic low data when the memory control switch is turned off.

* * * * *